(12) United States Patent
Malladi

(10) Patent No.: US 11,418,190 B2
(45) Date of Patent: Aug. 16, 2022

(54) SWITCH CIRCUITS AND TRANSISTOR STACKS WITH CAPACITOR NETWORKS FOR BALANCING OFF-STATE RF VOLTAGES AND METHODS OF THEIR OPERATION

(71) Applicant: NXP USA, Inc., Austin, TX (US)

(72) Inventor: Venkata Naga Koushik Malladi, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/113,671

(22) Filed: Dec. 7, 2020

(65) Prior Publication Data
US 2022/0182054 A1    Jun. 9, 2022

(51) Int. Cl.
H03K 17/70 (2006.01)
H03K 17/693 (2006.01)
H04B 1/44 (2006.01)

(52) U.S. Cl.
CPC ............. *H03K 17/693* (2013.01); *H04B 1/44* (2013.01)

(58) Field of Classification Search
CPC ................................ H03K 17/693; H04B 1/44
See application file for complete search history.

(56) References Cited

U.S. PATENT DOCUMENTS

| 5,329,247 | A | 7/1994 | Bayer |
| 8,401,496 | B2 | 3/2013 | Goto et al. |
| 8,536,636 | B2 | 9/2013 | Englekirk |
| 9,484,973 | B1 | 11/2016 | Carroll et al. |
| 9,780,090 | B2 * | 10/2017 | Fraser .................. H01L 27/085 |
| 10,200,027 | B1 * | 2/2019 | Kim ......................... H04B 1/40 |
| 10,326,440 | B1 * | 6/2019 | Malladi ................... H01L 23/66 |
| 10,784,862 | B1 * | 9/2020 | Malladi ................ H03K 17/102 |
| 10,972,091 | B1 * | 4/2021 | Malladi ................ H03K 17/162 |
| 11,128,266 | B1 * | 9/2021 | Fraser .................. H04W 52/52 |

(Continued)

FOREIGN PATENT DOCUMENTS

CN    113014204 A * 6/2021 ........... H03F 1/0288
EP    3565118 A1    11/2019

(Continued)

OTHER PUBLICATIONS

Shifrin, M. et al.; "High Power Control Components Using a New Monolithic FET Structure"; IEEE Digest of Papers, Microwave and Millimeter-Wave Monolithic Circuts Symposium; Long Beach, CA, US; 6 pages (Jun. 1989).

(Continued)

*Primary Examiner* — Adam D Houston
(74) *Attorney, Agent, or Firm* — Sherry Gourlay

(57) ABSTRACT

A switch circuit includes a transistor stack coupled between first and second ports. The transistor stack includes a group of multiple, adjacent, series-coupled transistors, and at least one additional transistor coupled in series with the group between the first and second ports to provide a first variably-conductive path between the first and second ports. The switch circuit also includes a balancing capacitor with a first terminal coupled to an input of the group of multiple, adjacent, series-coupled transistors, and a second terminal coupled to an output of the group of multiple, adjacent, series-coupled transistors.

18 Claims, 6 Drawing Sheets

(56) References Cited

U.S. PATENT DOCUMENTS

| | | | |
|---|---|---|---|
| 2009/0051424 A1* | 2/2009 | Liu | H04B 1/109 |
| | | | 330/250 |
| 2011/0001543 A1* | 1/2011 | Kondo | H01L 27/0207 |
| | | | 257/296 |
| 2014/0266415 A1 | 9/2014 | Kerr et al. | |
| 2014/0327399 A1* | 11/2014 | Wu | H02J 7/00 |
| | | | 327/109 |
| 2016/0071811 A1 | 3/2016 | Fuh et al. | |
| 2019/0036524 A1* | 1/2019 | Wilz | H03K 17/102 |
| 2020/0343884 A1 | 10/2020 | Atesal et al. | |
| 2021/0211127 A1* | 7/2021 | Shanjani | H03K 17/6872 |
| 2022/0038098 A1* | 2/2022 | Malladi | H04B 1/48 |

FOREIGN PATENT DOCUMENTS

| | | | | |
|---|---|---|---|---|
| EP | 3945677 A1 | * | 2/2022 | H03K 17/002 |
| KR | 100828909 B1 | * | 5/2008 | H04B 17/15 |
| WO | 2020005451 A1 | | 1/2020 | |

OTHER PUBLICATIONS

U.S. Appl. No. 16/944,612; not yet published; 42 pages (Jul. 31, 2020).

* cited by examiner

SWITCH CIRCUITS AND TRANSISTOR STACKS WITH CAPACITOR NETWORKS FOR BALANCING OFF-STATE RF VOLTAGES AND METHODS OF THEIR OPERATION

TECHNICAL FIELD

Embodiments of the subject matter described herein relate generally to RF switches that include transistor stacks, and methods for operating such RF switches and transistor stacks.

BACKGROUND

Radio frequency (RF) switches are commonly used in communication transceivers to selectively connect transmitter and receiver circuitry to an antenna or other communication means. To configure the transceiver in a transmit state, an RF switch is controlled to provide a signal path between transmitter and antenna ports of the RF switch, while establishing a high impedance (e.g., open circuit) between the antenna and receiver ports of the RF switch. Conversely, to configure the transceiver in a receive state, the RF switch is controlled to provide a signal path between the antenna and receiver ports, while establishing a high impedance (e.g., open circuit) between the transmitter and antenna ports.

Some RF switches include stacks (i.e., series-coupled arrangements) of field effect transistors (FETs) between their transmit, receive, and antenna ports to achieve higher power handling capability. However, non-uniform RF voltage distribution across the FETs in a stack may result in a relatively low power handling capability for the stack. Conventional techniques for balancing the RF voltage distribution may result in undesirably high levels of leakage currents when the stack is in the off state, which may in turn lead to undesirably high signal losses. Accordingly, what are needed are RF switches that are capable of withstanding higher off-state RF voltages, when compared with conventional RF switches, while achieving lower off-state leakage currents.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include radio frequency (RF) switches and transceivers for use in cellular base stations or other applications. In various embodiments, an RF switch includes at least one branch with a stack of series-coupled transistors. The stack includes a capacitor network coupled between terminals of the transistors, and the capacitor network functions to balance RF voltages (or more generally, "AC voltages") across the transistors when the stack is in an off state. At least one capacitor in the capacitor network is coupled across multiple transistors in the stack, which may result in reduced off-state leakage currents, when compared with conventional stacks with capacitive balancing networks. This configuration enables the stack to withstand relatively high power signals with relatively low off-state leakage currents and associated signal losses.

Before describing RF switch embodiments in detail, examples of systems, devices, and modules in which such RF switch embodiments may be implemented are described in conjunction with FIGS. 1-4. It is to be understood that the later-described RF switch embodiments may be implemented in a wide variety of other systems, devices, modules, and circuits. Therefore, the example system, device, and module illustrated in FIGS. 1-4 are not to be construed as limiting the scope of the inventive subject matter.

Figure 1:
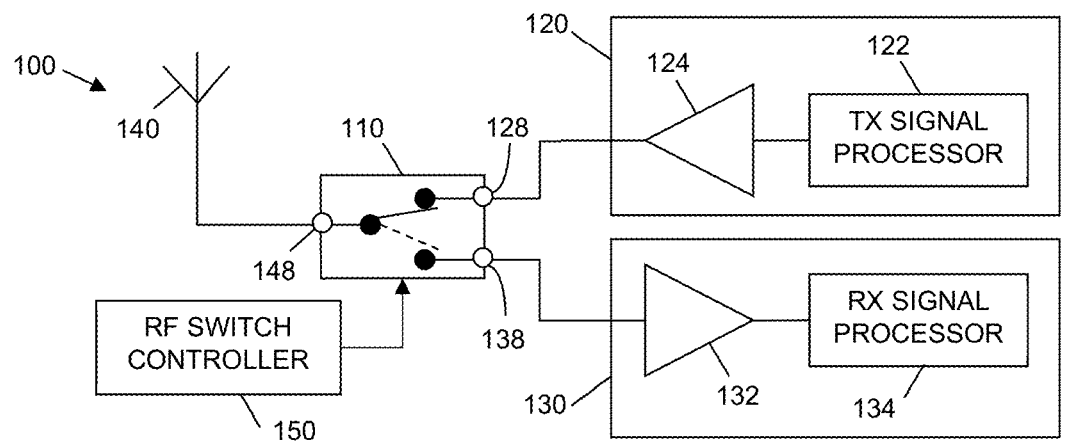
FIG. 1 is a simplified block diagram of an embodiment of a radio frequency (RF) transceiver system.

FIG. 1 is a simplified block diagram of an example of an RF transceiver system 100 that includes an RF switch 110, a transmitter 120, a receiver 130, an antenna 140, and an RF switch controller 150. Transceiver system 100 is a half-duplex transceiver, in which only one of the transmitter 120 or the receiver 130 are coupled, through the RF switch 110, to the antenna 140 at any given time. More specifically, the state of the RF switch 110 is controlled by RF switch controller 150 to alternate between coupling an RF transmit signal produced by the transmitter 120 to the antenna 140, or coupling an RF receive signal received by the antenna 140 to the receiver 130.

The transmitter 120 may include, for example, a transmit (TX) signal processor 122 and a power amplifier 124. The transmit signal processor 122 is configured to produce transmit signals, and to provide the transmit signals to the power amplifier 124. The power amplifier 124 amplifies the transmit signals and provides the amplified transmit signals to the RF switch 110. The receiver 130 may include, for example, a receive amplifier 132 (e.g., a low noise amplifier) and a receive (RX) signal processor 134. The receive amplifier 132 is configured to amplify relatively low power received signals from the RF switch 110, and to provide the amplified received signals to the receive signal processor 134. The receive signal processor 134 is configured to consume or process the receive signals.

During each transmit time interval, when the transceiver 100 is in a "transmit mode," the RF switch controller 150 controls the RF switch 110 to be in a first or "transmit" state, as depicted in FIG. 1, in which a conductive transmit signal path is established between transmitter node 128 and antenna node 148, and in which a receive signal path is in a high impedance state (e.g., open circuit) between antenna node 148 and receiver node 138. Conversely, during each receive time interval, when the transceiver 100 is in a "receive mode," the RF switch controller 150 controls the RF switch 110 to be in a second or "receive" state, in which a conductive receive signal path, indicated by a dashed line in FIG. 1, is established between antenna node 148 and receiver node 138, and in which the transmit signal path is in a high impedance state (e.g., open circuit) between transmitter node 128 and antenna node 148.

Figure 2:
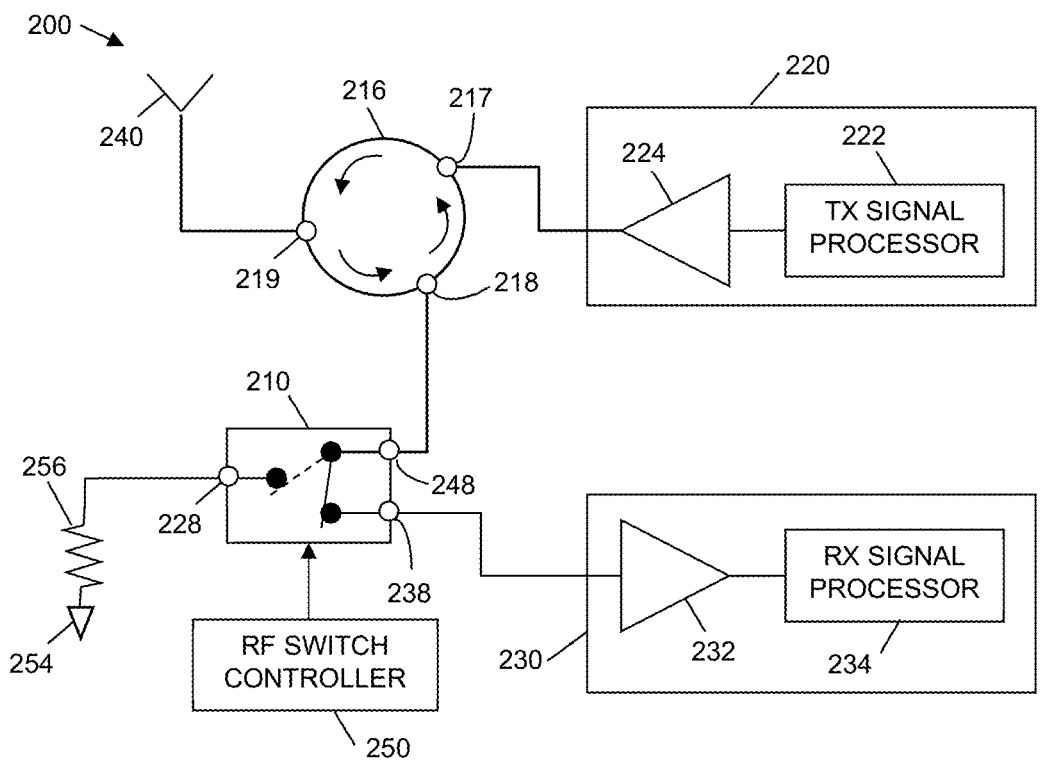
FIG. 2 is a simplified block diagram of another embodiment of an RF transceiver system.

FIG. 2 is a simplified block diagram of another example of RF transceiver system 200 that includes an RF switch 210, a circulator 216, a transmitter 220, a receiver 230, an antenna 240, and an RF switch controller 250. The transmitter 220 and the receiver 230 are coupled to the antenna 240 through the circulator 216. More specifically, the circulator 216 is a three-port device, with a first port 217 coupled to the transmitter 220, a second port 218 couplable to the receiver 230 through RF switch 210, and a third port 219 coupled to the antenna 240. The RF switch 210 also is a three-port device, with a first port 248 coupled to the receiver port 218 of the circulator 216, a second port 238 coupled to the receiver 230, and a third port 228 coupled to a ground reference node 254 through a resistor 256.

Again, the transmitter 220 may include, for example, a TX signal processor 222 and a power amplifier 224. The transmit signal processor 222 is configured to produce transmit signals, and to provide the transmit signals to the power amplifier 224. The power amplifier 224 amplifies the transmit signals and provides the amplified transmit signals to the antenna 240 through the circulator 216. The receiver 230 may include, for example, a receive amplifier 232 (e.g., a low noise amplifier) and an RX signal processor 234. The receive amplifier 232 is configured to amplify relatively low power received signals received from the antenna 240 (through the circulator 216 and the RF switch 210), and to provide the amplified received signals to the receive signal processor 234. The receive signal processor 234 is configured to consume or process the receive signals.

The circulator 216 is characterized by a signal-conduction directivity, which is indicated by the arrows within the depiction of circulator 216. Essentially, RF signals may be conveyed between the circulator ports 217-219 in the indicated direction (counter-clockwise), and not in the opposite direction (clockwise). Accordingly, during normal operations, signals may be conveyed through the circulator 216 from transmitter port 217 to antenna port 219, and from antenna port 219 to receiver port 218, but not directly from transmitter port 217 to receiver port 218 or from receiver port 218 to antenna port 219.

In some situations, while the transceiver 200 is in the transmit mode, the circulator 216 may not be able to convey signal energy received through transmitter port 217 from the transmitter 220 to the antenna 240 through antenna port 219. For example, the antenna 240 may be disconnected from the antenna port 219, or may otherwise be in a very high impedance state. In such situations, the circulator 216 may convey signal energy from the transmitter 220 (i.e., signal energy received through transmitter port 217) past the antenna port 219 to the receiver port 218. To avoid conveying transmitter signal energy into the receiver 230 while the transceiver 200 is in the transmit mode, the RF switch controller 250 operates the RF switch 210 as a fail-safe switch by coupling the first port 248 to a ground reference node 254.

More specifically, when the transceiver 200 is in a receive mode, the RF switch 210 is controlled by RF switch controller 250 to be in a receive state, as shown in FIG. 2. In the receive state, the receiver port 218 of the circulator 216 is coupled through RF switch 210 to the receiver 230 (i.e., RF switch controller 250 configures RF switch 210 to have a conductive path between ports 248 and 238, and a high-impedance, open-circuit condition between ports 248 and 228). Conversely, when the transceiver 200 is in a transmit mode, the RF switch 210 is controlled by RF switch controller 250 to be in a transmit state, in which the receiver port 218 of the circulator 216 is coupled through the RF switch 210 to the ground termination 254 through resistor 256 (i.e., RF switch controller 250 configures RF switch 210 to have a conductive path, indicated by a dashed line in FIG. 2, between ports 248 and 228, and a high-impedance, open-circuit condition between ports 248 and 238). Accordingly, if the transmitter signal energy bypasses the antenna port 219 while the transceiver 200 is in the transmit mode, any signal energy that is conveyed through the receiver port 218 of the circulator 216 to the RF switch 210 will be shunted to the ground termination 254 through port 228 of the RF switch 210.

The RF transceiver systems 100, 200 (FIGS. 1, 2) may be physically implemented using a variety of active and passive electrical devices, which may be housed in one or more device packages and/or on one or more printed circuit boards (PCBs) and/or other substrates. More specifically, various components of the RF transceiver systems 100, 200 may be implemented in self-contained modules or electrical devices, which may be coupled to a substrate that electrically connects the module/devices to other portions of the RF transceiver system 100, 200. As used herein, the term "module" means a set of active and/or passive electrical devices (e.g., ICs and components) that are physically contained within a single housing (e.g., the device(s) are coupled to a common "module substrate" or within a single device package). A "module" also includes a plurality of conductive terminals for electrically connecting the set of devices to external circuitry that forms other portions of an electrical system. Essentially, the module substrate configuration, the method of coupling the device(s) to the module's terminals, and the number of devices within the module defines the module type. For example, in various embodiments, a module may be in the form of a PCB-based system, a surface mount device, a chip carrier device, a ball, pin, or land grid array device, a flat package device (e.g., a quad or dual flat no-lead package), a chip scale packaged device, a system-in-package (SiP) device, or in the form of some other type of integrated circuit package. Although two particular types of modules/devices are described below in conjunction with FIGS. 3 and 4, it is to be understood that embodiments of the inventive subject matter may be included in other types of modules/devices, as well.

Figure 3:
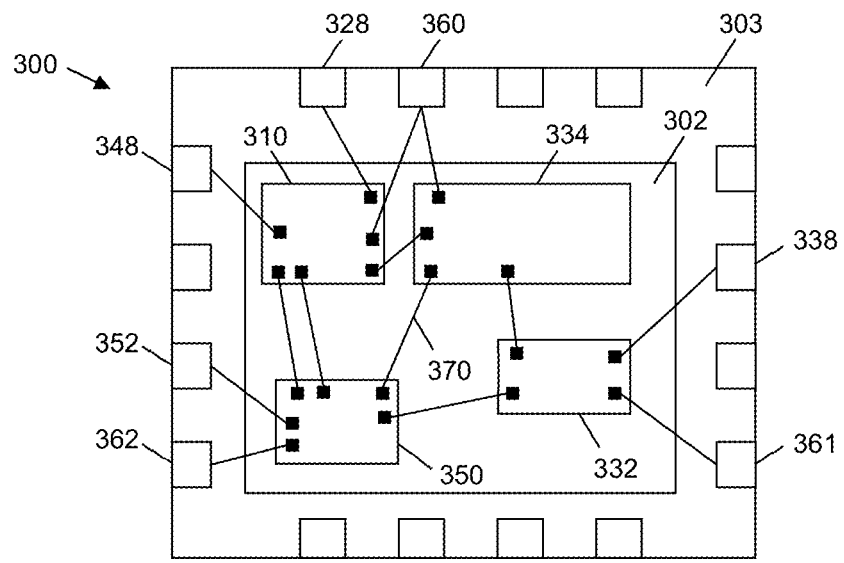
FIG. 3 is a top view of a surface mount device that embodies a portion of the RF transceiver system of FIG. 1 or FIG. 2, in accordance with an embodiment.

For example, FIG. 3 is a top view of a device 300 that embodies a portion of the RF transceiver system 100 of FIG. 1, in accordance with an embodiment. More specifically, FIG. 3 illustrates that portions of the transceiver may be packaged in a surface mount package. Device 300 is packaged as a quad flat no-lead (QFN) device, which includes a conductive pad 302 and a plurality of terminals (e.g., terminals 328, 338, 348, 352, 360, 361, 362) held in a fixed spatial relationship with non-conductive encapsulation 303 (e.g., plastic encapsulation). Device 300 also includes a plurality of ICs coupled to the conductive pad 302, including an RF switch integrated circuit (IC) 310 (e.g., an IC that embodies RF switch 110, FIG. 1), a receive amplifier IC 332 (e.g., receive amplifier 132, FIG. 1), a receive matching circuit IC 334, and an RF switch controller IC 350 (e.g., an IC that embodies RF switch controller 150, FIG. 1). In addition, device 300 includes a transmit signal input terminal 328 (e.g., corresponding to transmitter node 128, FIG. 1), a receive signal output terminal 338 (e.g., corresponding to receiver node 138, FIG. 1), an antenna terminal 348 (e.g., corresponding to antenna terminal 148, FIG. 1), a transmit/receive (TX/RX) control signal terminal 352, one or more ground terminals 360, 361, and one or more power terminals 362.

The various ICs 310, 332, 334, 350 and terminals 328, 338, 348, 352, 360-362 are electrically connected together through a plurality of wirebonds (e.g., wirebond 370). In other embodiments, various ones of the ICs 310, 332, 334, 350 and terminals 328, 338, 348, 352, 360-362 may be electrically connected together using other conductive structures. In various embodiments, the device 300 may be housed in an air-cavity package or an overmolded (e.g., encapsulated) package, although the device 300 may be considered to be complete without such packaging, as well.

After incorporation of device 300 into a transceiver system (e.g., system 100, FIG. 1), and during operation of the transceiver system, power and ground reference voltages may be provided to device 300 through power and ground terminals 360-362. RF switch controller IC 350 may receive transmit/receive mode control signals through a control signal terminal 352. Based on the received mode control signals, the RF switch controller IC 350 provides switch control signals to, or "drives", the control terminals (e.g., gates) of various transistors (e.g., transistors within branches 520, 524, 530, 534, 820, 824, 830, 834, FIGS. 5, 8) of the RF switch IC 310. As will be described in more detail later, the switch control signals determine whether each of the various transistors is in a conducting or non-conducting state at any given time. More specifically, the switch control signals determine whether the RF switch IC 310 is in a transmit state (i.e., a state in which the switch is configured to convey an RF signal from the transmitter 120 to the antenna 140) or a receive state (i.e., a state in which the switch is configured to convey an RF signal from the antenna 140 to the receiver 130) at any given time.

When the switch control signals configure the RF switch IC 310 in the transmit state, transmit signals received by the RF switch IC 310 from a power amplifier (e.g., power amplifier 124, FIG. 1) through the transmit signal input terminal 328 are passed through the RF switch IC 310 to the antenna terminal 348. Conversely, when the switch control signals place the RF switch IC 310 in the receive state, signals received from the antenna terminal 348 are passed through the RF switch IC 310 to the receive matching circuit IC 334. The receive matching circuit IC 334 may include one or more integrated passive devices (e.g., capacitors, inductors, and/or resistors). The integrated passive devices, along with inductances of the wirebonds 370 between the receive matching circuit IC 334, the RF switch IC 310, and the receive amplifier IC 332, compose an impedance matching circuit between the RF switch IC 310 and the receive amplifier IC 332. In an alternate embodiment, the receive matching circuit IC 334 may be replaced by discrete components. Either way, the impedance matching circuit also may perform filtering of receive signals that pass from the RF switch IC 310 to the receive amplifier IC 332 through the impedance matching circuit. The receive amplifier IC 332 receives the receive signals from the receive matching circuit IC 334, and amplifies the receive signals. The receive amplifier IC 332 then provides the amplified receive signals to receive signal output terminal 338.

Figure 4:
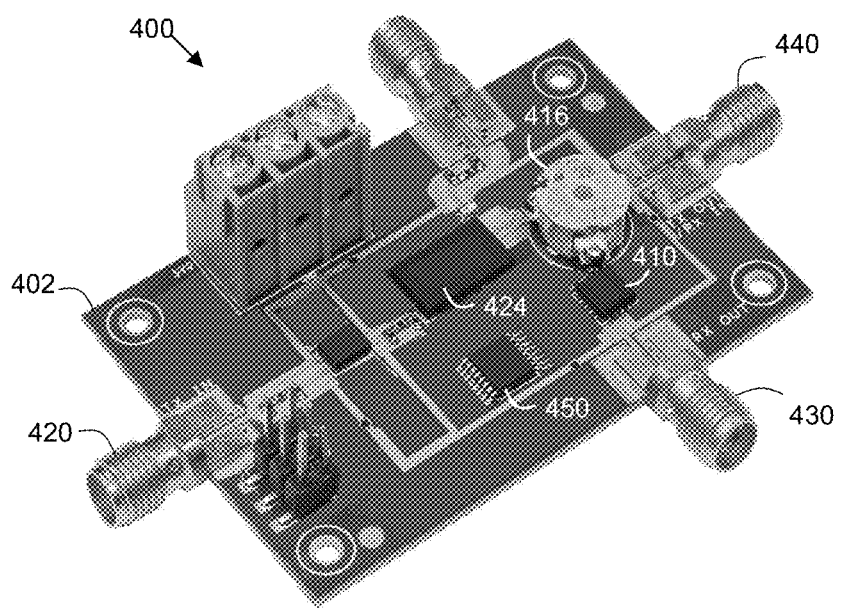
FIG. 4 is a top view of a module that embodies a portion of the RF transceiver system of FIG. 1 or FIG. 2, in accordance with an embodiment.

FIG. 4 is a perspective view of a module 400 that embodies a portion of the RF transceiver system 200 of FIG. 2, in accordance with an embodiment. More specifically, FIG. 4 illustrates that portions of the transceiver may be configured as a printed circuit board (PCB) module. The components of module 400 are mounted on (or coupled to) a system substrate 402, which may be, for example, a multi-layer PCB or other type of substrate. More specifically, module 400 includes a plurality of ICs and devices coupled to the system substrate 402, including a transmit amplifier module 424 (e.g., a module that embodies RF amplifier 224, FIG. 2), an RF switch and receive amplifier module 410 (e.g., a module that embodies RF switch 210 and the receive amplifier 232, FIG. 2), a circulator 416 (e.g., circulator 216, FIG. 2), and an RF switch controller IC 450 (e.g., an IC that embodies RF switch controller 250, FIG. 2). In addition, device 400 includes a transmit signal input connector 420 (e.g., corresponding to the input to amplifier 224, FIG. 2), a receive signal output connector 430 (e.g., corresponding to the output of amplifier 232, FIG. 2), and an antenna connector 440 (e.g., corresponding to an input to antenna 240, FIG. 2). The various ICs, devices, and connectors 410, 416, 420, 424, 430, 440, 450 are electrically connected together through a plurality of conductive traces on and within the system substrate 402.

After incorporation of module 400 into a transceiver system (e.g., system 200, FIG. 2), and during operation of the transceiver system, power and ground reference voltages may be provided to device 400 through power and ground terminals (not numbered). RF switch controller IC 450 may receive transmit/receive mode control signals through a control signal terminal (not numbered). Based on the received mode control signals, the RF switch controller IC 450 provides switch control signals to control terminals (e.g., gates) of various transistors (e.g., transistors within branches 520, 524, 530, 534, 820, 824, 830, 834, FIGS. 5, 8) of the RF switch (e.g., RF switch 210, FIG. 2) within the RF switch and receive amplifier module 410. As will be described in more detail later, the switch control signals determine whether each of the various transistors is in a conducting or non-conducting state at any given time. More specifically, the switch control signals determine whether the RF switch within module 410 is in a transmit state or a receive state. When the RF switch is in the transmit state, the RF switch is configured to convey an RF signal from the circulator 416 to a ground reference terminal (e.g., node 254, FIG. 2). When the RF switch is in the receive state, the RF switch is configured to convey an RF signal from the circulator 216 to the receive amplifier (e.g., amplifier 232, FIG. 2) within module 410.

Those of skill in the art would understand, based on the description herein, that although the transceiver 100 of FIG. 1 is shown in FIG. 3 to be implemented as a surface-mount device (i.e., QFN device 300, FIG. 3), transceiver 100 alternatively could be implemented as a PCB-based module (e.g., similar to PCB-based module 400, FIG. 4). Similarly, those of skill in the art would understand, based on the description herein, that although the transceiver 200 of FIG. 2 is shown in FIG. 4 to be implemented as a PCB-based module (i.e., module 400, FIG. 4), transceiver 200 alternatively could be implemented as a surface-mount device (e.g., similar to QFN device 300, FIG. 3). Transceivers 100, 200 could be implemented and/or packaged in other forms, as well.

Figure 5:
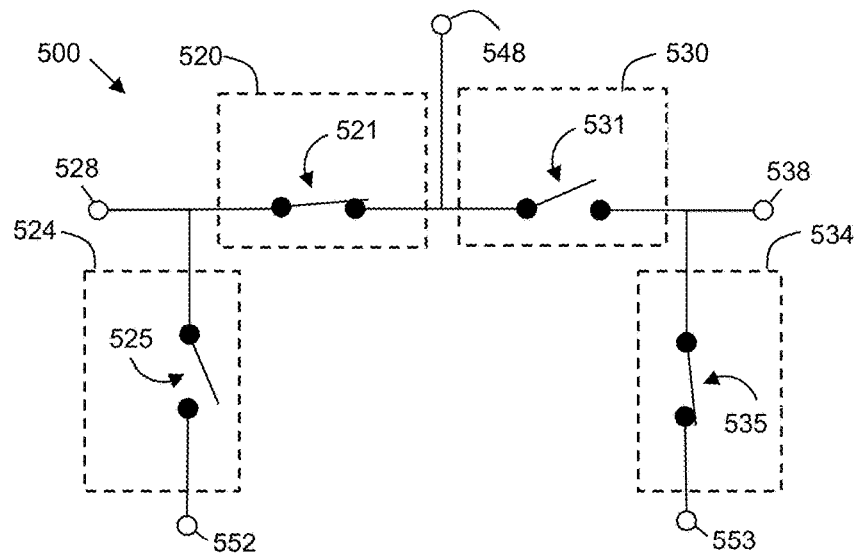
FIG. 5 is a simplified circuit diagram of an RF switch, in accordance with an embodiment.

Details regarding embodiments of an RF switch (e.g., RF switch 110, 210, FIGS. 1, 2) will now be discussed. In particular, FIG. 5 is a simplified circuit diagram of an RF switch 500, in accordance with an embodiment. RF switch 500 may provide the functionality of RF switch 110 (FIG. 1) and/or RF switch 210 (FIG. 2). RF switch 500 includes a plurality of input/output (I/O) ports, including a first port 528 (e.g., port 128, 228, FIGS. 1, 2), a second port 538 (e.g., port 138, 238, FIGS. 1, 2), a third port 548 (e.g., port 148, 248, FIGS. 1, 2), and voltage reference ports 552, 553, in an embodiment.

Further, RF switch 500 includes a plurality of "branches" 520, 524, 530, 534 electrically coupled between the various ports 528, 538, 548, 552, 553. As used herein, a switch "branch" includes the switching circuitry connected between any two ports of an RF switch. Accordingly, RF switch 500 is shown to include four branches, where a first branch 520 ("TX series branch") includes switch circuitry between ports 528 and 548, a second branch 524 ("TX shunt branch") includes switch circuitry between ports 528 and 552, a third branch 530 ("RX series branch") includes switch circuitry between ports 538 and 548, and a fourth branch 534 ("RX shunt branch") includes switch circuitry between ports 538 and 553.

According to the illustrated embodiment, each branch 520, 524, 530, 534 includes a "switch" 521, 525, 531, 535. As used herein, the term "switch", as it applies to each of elements 521, 525, 531, 535, may mean a single active switching device (e.g., a single FET) or a plurality of active switching devices (e.g., multiple FETs) that are coupled in series between two ports of an RF switch, thus comprising a "stack" of FET switches, or a "FET stack," as will be defined later.

If RF switch 500 were implemented in the transceiver 100 of FIG. 1, for example, port 528 may correspond to port 128, and thus may be coupled to transmitter 120. Port 538 may correspond to port 138, and thus may be coupled to receiver 130. Port 548 may correspond to port 148, and thus may be coupled to antenna 140. Finally, ports 552, 553 may be coupled to ground reference nodes. In an alternate embodiment, if RF switch 500 were implemented in the transceiver of FIG. 1, port 528 may correspond to port 138, and thus may be coupled to receiver 130, and port 538 may correspond to port 128, and thus may be coupled to transmitter 120.

Conversely, if RF switch 500 were implemented in the transceiver 200 of FIG. 2, for example, port 548 may correspond to port 248, and thus may be coupled to the receiver port 218 of circulator 216. Port 538 may correspond to port 238, and thus may be coupled to receiver 230. Port 528 may correspond to port 228, and thus may be coupled to ground reference node 254 through resistor 256. Finally, ports 552, 553 also may be coupled to ground reference nodes. In an alternate embodiment, if RF switch 500 were implemented in the transceiver of FIG. 2, port 528 may correspond to port 238, and thus may be coupled to receiver port 218 of circulator 216, and port 538 may correspond to port 228, and thus may be coupled to ground reference node 254 through resistor 256.

During operation of RF switch 500, the state of the RF switch 500 is controlled (e.g., by RF switch controller 150, 250, FIGS. 1, 2) based on whether the system (e.g., transceiver 100, 200, FIGS. 1, 2) is in a transmit mode or a receive mode (e.g., during a transmit time interval or a receive time interval, respectively, of a wireless communication session). More specifically, when the system is in a transmit mode (as shown in FIG. 5), the state of the RF switch 500 is controlled to establish a low-impedance connection between port 548 and port 528, and to establish a high-impedance between port 548 and port 538. Further, in the transmit mode, the state of the RF switch 500 is controlled to establish a low-impedance connection between port 538 and port 553, and to establish a high-impedance between port 528 and port 552. In other words, in the transmit mode, switches 521 and 535 are closed, and switches 525 and 531 are open.

Conversely, when the system is in a receive mode, the state of the RF switch 500 is controlled to establish a low-impedance connection between port 548 and port 538, and to establish a high-impedance between port 548 and port 528. Further, in the receive mode, the state of the RF switch 500 is controlled to establish a low-impedance connection between port 528 and port 552, and to establish a high-impedance between port 538 and port 553. In other words, in the receive mode, switches 525 and 531 are closed, and switches 521 and 535 are open.

According to an embodiment, each switch 521, 525, 531, 535 is implemented as a "stack" of series-coupled FETs that is electrically coupled between two ports. For example, FIG. 6 is a simplified circuit diagram of a stack 600 of FETs that may be used in one or more branches (e.g., one or more of branches 520, 524, 530, 534, FIG. 5) of an RF switch (e.g., switch 110, 210, 310, 410, 500, FIGS. 1-5), in accordance with an example embodiment.

As used herein, the terms "stack" and "FET stack" refer to multiple FETs that are coupled in series with each other (or "series-coupled") between two ports of an RF switch. Each stack may be considered to be a "switch" or a "variably-conductive path", in that the conductivity of a signal through the stack (or more specifically through the series of channels of the FETs in the stack) can be controlled or varied (i.e., increased or decreased) based on control signals provided at the stack control terminals (e.g. terminals 658, 758, FIGS. 6, 7). In other words, a stack (or switch or variably-conductive path) can be placed in a low-impedance state (e.g., closed, "on state" or "on-state") or a high-impedance state (e.g., open, "off state" or "off-state") based on control signals provided at the stack control terminal. Further, the terms "coupled in series" and "series-coupled," in reference to the electrical coupling between multiple FETs in a stack, means that the current-conducting terminals (e.g., source/drain terminals) of the multiple FETs are connected together to provide a continuous electrically conductive channel/path between a first port (e.g., port 628, 728, FIGS. 6, 7) and a second port (e.g., port 648, 748, FIGS. 6, 7) when the multiple FETs are in a conducting state (e.g., "on" or "closed").

Figure 6:
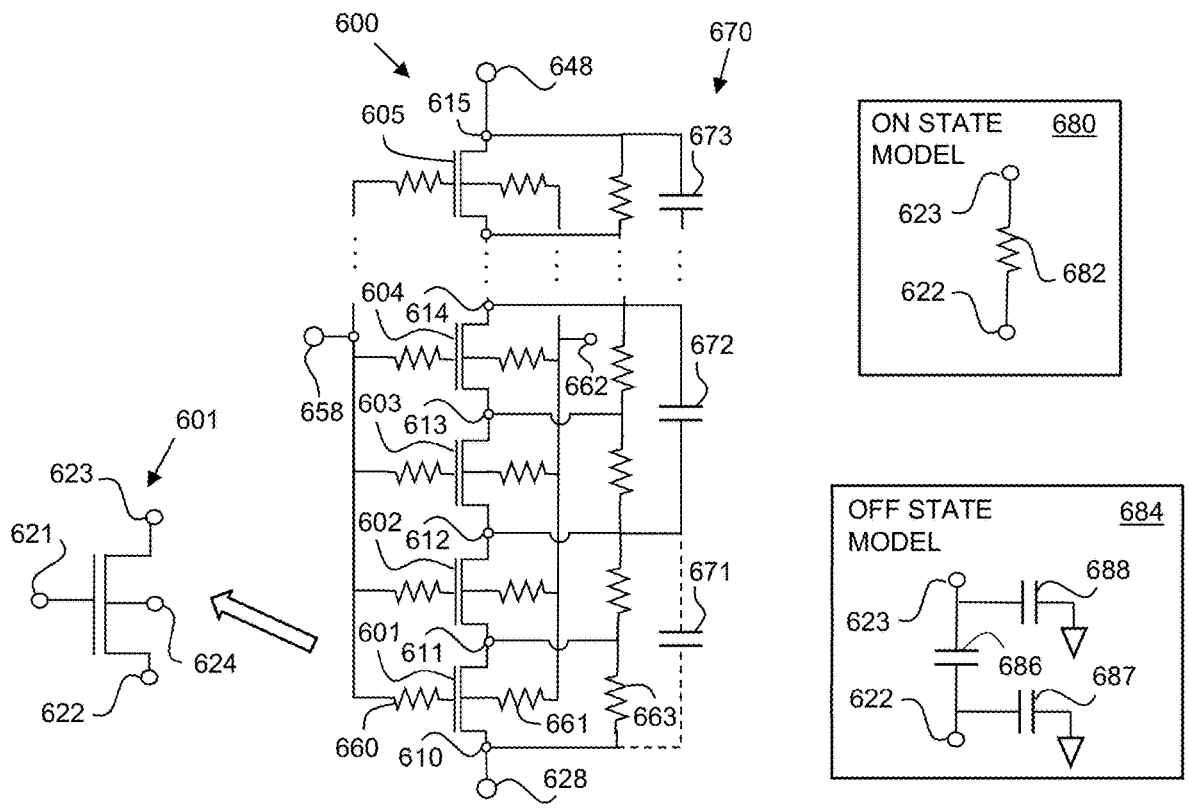
FIG. 6 is a simplified circuit diagram of a stack of FETs that may be used in one or more branches of an RF switch, in accordance with an embodiment.

FIG. 6 is a simplified circuit diagram of a stack 600 of FETs 601-605 that may be used in one or more branches of an RF switch (e.g., one or more of branches 520, 524, 530, 534 of switch 500, FIG. 5), in accordance with an example embodiment. According to the embodiment illustrated in FIG. 6, stack 600 includes a plurality of series-coupled FETs 601, 602, 603, 604, 605 that are electrically coupled between port 628 and port 648. As best depicted in the enlarged view of FET 601 to the left of stack 600, each FET 601-605 includes a gate terminal 621 (or "control terminal"), a source terminal 622, and a drain terminal 623. According to some embodiments, each FET 601-605 also may include a body bias terminal 624, which enables a DC bias voltage to be provided to the FET body. The electrical conductivity of a variable-conductivity channel between the source and drain terminals of any given FET is controlled by control signals provided to the FET's gate terminal (e.g., terminal 621). Some (and possibly all) of the above-discussed FETs may be "single-gate FETs", although some or all of the FETs may be "multiple-gate FETs", as well. Essentially, a single-gate FET is a monolithic transistor device that includes a variable-conductivity channel between drain and source terminals, along with only one gate positioned over the channel. Conversely, a multiple-gate FET is a monolithic transistor device that includes a variable-conductivity channel between drain and source terminals, along with multiple gates positioned over the channel. Electrical signals provided to the multiple gates control the conductivity of the channel during operation of the FET. In some applications, utilization of multiple gates may enable better electrical control over the channel, when compared with single-gate FETs. This, in turn, may enable more effective suppression of off-state leakage current, and/or enhanced current in the on state (i.e., drive current).

As used herein, a "current-conducting node" is a conductive node of stack 600 that is directly coupled to a source and/or drain terminal of one or more of the FETs 601-605 of the stack 600. In the series-coupled sequence of FETs corresponding to stack 600, the source terminal 622 of FET 601 may be coupled through current-conducting node 610 to port 628, the drain terminal 623 of FET 601 may be coupled through current-conducting node 611 to the source terminal of FET 602, the drain terminal of FET 602 may be coupled through current-conducting node 612 to the source terminal of FET 603, the drain terminal of FET 603 may be coupled through current-conducting node 613 to the source terminal of FET 604, the drain terminal of FET 604 may be coupled through current-conducting node 614 (and through zero or more additional FETs, not illustrated) to the source terminal of FET 605, and the drain terminal of FET 605 may be coupled through current-conducting node 615 to port 648.

The stack 600 of FIG. 6 is depicted to include five series-coupled FETs 601-605. However, as indicated by the ellipses between FETs 604 and 605, a stack may include more than five FETs. A stack also may include fewer than five FETs. Further, although the description herein refers to series-coupled arrangements in which a first FET has a source terminal connected to a port, and has a drain terminal connected to a source terminal of a second FET, the source and drain terminal connections could be reversed, in other embodiments (e.g., a series-coupled arrangement may have a first FET with a drain terminal connected to a port, and a source terminal connected to a drain terminal of a second FET). More generally, each of the source and drain terminals of a FET may be referred to as a "current-conducting terminal," and that term could be used interchangeably for either a source terminal or a drain terminal.

According to an embodiment, during operation, the control signals provided to the series-coupled FETs in stack 600 are synchronous, in that they simultaneously cause all of the FETs in the stack 600 either to be substantially conducting (e.g., "on" or "closed") or substantially non-conducting (e.g., "off" or "open"). To accomplish simultaneous control of all FETs in each stack 600, the gate terminals of the FETs in each stack may be electrically coupled to a single control node. For example, in FIG. 6, the gate terminals of FETs 601-605 are electrically coupled to stack control terminal 658.

In addition to the FETs 601-605, stack 600 may include a DC bias distribution network of high-value (e.g., multiple kiloohm) resistors (e.g., including resistor 663), in an embodiment, where each resistor is coupled between the source and drain terminals of a FET 601-605 (e.g., resistor 663 has a first terminal coupled to the source terminal of FET 601, and a second terminal coupled to the drain terminal of FET 601). The DC bias distribution network essentially ensures that the DC bias voltage provided to the drains/sources of each FET 601-603 in the stack is the same.

Stack 600 also may include an RF blocking network of high-value (e.g., multiple kiloohm) resistors (e.g., resistor 660) coupled between the gate terminals of the FETs 601-605 and the stack control terminal 658, in an embodiment. The RF blocking network presents a high impedance to RF signal energy to ensure that the RF signal energy conveyed through a branch does not leak to the control/driver circuitry (e.g., to controller 150, 250, FIGS. 1, 2).

Further still, stack 600 also may include body bias circuitry coupled between the body node of each FET, if included, and the body bias terminal (e.g., body bias terminal 624, FIG. 6). The body bias circuitry also may include an RF blocking network of high-value (e.g., multiple kiloohm) resistors (e.g., resistor 661) coupled between the body nodes of the FETs and a body bias terminal 662 for the stack 600, in an embodiment. Again, the RF blocking network presents a high impedance to RF signal energy to ensure that the RF signal energy conveyed through a branch does not leak to the body bias circuitry.

As indicated previously, a system that includes stack 600 may include a switch controller (e.g., switch controller 150, 250, FIGS. 1, 2) with a driver that is coupled to the stack control terminal 658. To cause the entire stack 600 to become substantially conductive between the ports to which the stack is connected (e.g., to turn the stack "on" or to "close" the switch), the driver provides a control signal (or "drive signal") to the stack control terminal 658. That control signal causes all of the FETs 601-605 within the stack 600 simultaneously to become substantially conducting, thus causing stack 600 to become substantially conductive between ports 628 and 648. In other words, the FETs 601-605 and stack 600 are in the "on state". As shown in box 680 to the right of stack 600, in the "on state", each FET 601-605 may be simply modeled as a resistor 682 with a first terminal corresponding to the drain terminal 622, and a second terminal corresponding to the source terminal 623. Alternatively, the driver may provide a control signal to stack control terminal 658, which simultaneously causes all of FETs 601-605 to become substantially non-conducting, thus causing stack 600 to become substantially non-conductive between ports 628 and 648. In other words, the FETs 601-605 and stack 600 are in the "off state". As shown in box 684 to the right of stack 600, in the "off state", each FET 601-605 may be simply modeled as a capacitor 686 ("Cds") with a first terminal corresponding to the drain terminal 622, and a second terminal corresponding to the source terminal 623, along with a first additional shunt capacitance 687 ("Csub1") between the source terminal and a ground reference, and a second additional shunt capacitance 688 ("Csub2") between the drain terminal and the ground reference. Csub1 687 and Csub2 688 represent the parasitic capacitance from the transistor body to the semiconductor substrate on which the FET is formed.

In the off state, the parasitic capacitances modeled by Csub1 687 and Csub2 688 each may facilitate an undesirable leakage current between the FET and the substrate, which ultimately results in RF signal loss. Further, these leakage currents may create an unequal or non-uniform RF voltage division across the stack 600. This non-uniform voltage distribution across the stack 600 may lead to a lower power handling capability for the stack 600, because in the off state, the first and/or first few FETs in the stack may experience the stack breakdown voltage before the rest of the FETs in the off-state branch.

To balance the voltage distribution across the stack 600, and thus to increase the RF voltage handling capability of the stack 600, stack 600 also includes a network 670 of "balancing" capacitors 671-673, in an embodiment. The balancing capacitors 671-673 are coupled between some (but not all) of the current-conducting nodes 610-615 of the stack 600, in an embodiment, meaning that each balancing capacitor is connected across a different group of multiple FETs 601-605 in the stack 600. In the embodiment of FIG. 6, for example, each balancing capacitor 671-673 is connected across a different group of two adjacent FETs in the series-coupled arrangement of FETs 601-605 in stack 600, where "two adjacent FETs" means two FETs that are directly connected together through an intermediate current-conducting node (e.g., FETs 601 and 602 are "adjacent" because the drain of FET 601 is directly connected to the source of FET 602 through intermediate current-conducting node 611). More specifically, a first balancing capacitor 671 is coupled across a first group of two FETs 601 and 602, where a first terminal of capacitor 671 is coupled to current-conducting node 610 (and thus to the source of FET 601), and a second terminal of capacitor 671 is coupled to current-conducting node 612 (and thus to the drain of FET 602 and the source of FET 603). Node 610 may be considered to be an "input" of the first group of FETs 601, 602, and node 612 may be considered to be an "output" of the first group of FETs 601, 602. A second balancing capacitor 672 is coupled across a second group of two FETs 603 and 604, where a first terminal of capacitor 672 is coupled to current-conducting node 612 (and thus to the drain of FET 602 and the source of FET 603), and a second terminal of capacitor 672 is coupled to current-conducting node 614 (and thus to the drain of FET 604 and the source of FET 605). Node 612 may be considered to be an "input" of the second group of FETs 603, 604, and node 614 may be considered to be an "output" of the second group of FETs 603, 604. Finally, a third balancing capacitor 673 is coupled across a third group of two FETs (including a non-illustrated FET and FET 605). As indicated by the ellipses in FIG. 6, additional groups of FETs and associated balancing capacitors may be coupled between FETs 604 and 605. It should be noted that current-conducting nodes that are in-between the FETs in any given group (e.g., current-conducting nodes 611 and 613) are not directly connected to the network 670 of balancing capacitors 671-673. According to an embodiment, each of the balancing capacitors 671-673 has a capacitance value in a range of about 50 femtofarads (fF) to about 500 fF, although the capacitance values may be lower or higher, as well.

In some embodiments, balancing capacitors 671-673 are connected across all of the groups of FETs 601-605 in the stack 600. In other embodiments, balancing capacitors may be connected across some, but not all, FETs in the stack 600. For example, as indicated with the dashed-line connections between balancing capacitor 671 and nodes 610, 612, balancing capacitor 671 may be omitted. In other embodiments, one or more other or additional balancing capacitors may be omitted (e.g., balancing capacitor 672 and/or 673 also or alternatively may be omitted).

By utilizing balancing capacitors 671-673 connected as shown in FIG. 6, AC voltage swings may be substantially equalized across all FETs in an off-state FET branch of an RF switch, thereby potentially preventing the first and/or first few FETs from experiencing the stack breakdown voltage before the rest of the FETs in the off-state branch. This may significantly improve the power handling capability of the switch branch.

In the stack 600 of FIG. 6, each of the balancing capacitors 671-673 is connected across a different group of two adjacent, series-coupled FETs in the stack 600. In alternate embodiments, the balancing capacitors may be connected across groups of more than two series-coupled FETs, and/or the balancing capacitors may be connected across groups of FETs that include different numbers of series-coupled FETs. To illustrate this concept in a more generic way, reference is made to FIG. 7, which is a simplified circuit diagram of a stack 700 of FETs 701-709 that may be used in one or more branches of an RF switch (e.g., one or more of branches 520, 524, 530, 534 of switch 500, FIG. 5), in accordance with another embodiment. Each FET 701-709 includes gate, source, drain, and (optionally) body bias terminals (e.g., terminals 621-624, FIG. 6), and the on and off states of the FETs 701-709 may be modeled as depicted in boxes 680, 684 (FIG. 6), respectively. Further, each FET 701-709 may be a single-gate FET or a multiple-gate FET.

The FETs 701-709 of stack 700 are divided into groups 780, 781, 782 of FETs, where each group 780-782 includes three or more (as indicated by the ellipses) adjacent, series-coupled FETs. In various embodiments, each group 780-782 may include from three to 10 FETs, for example, and the number of FETs in each group 780-782 may be the same or different. Although stack 700 is shown to include three groups 780-782 of FETs, stack 700 may include as few as two groups, or more than three groups, in other embodiments.

In the series-coupled sequence of FETs corresponding to stack 700, the source terminal of FET 701 may be coupled through current-conducting node 710 to port 728, the drain terminal of FET 701 may be coupled through current-conducting node 711 to the source terminal of FET 702, the drain terminal of FET 702 may be coupled through current-conducting node 712 (and through zero or more additional FETs, not illustrated) to the source terminal of FET 703, the drain terminal of FET 703 may be coupled through current-conducting node 713 (and through zero or more additional FETs, not illustrated) to the source terminal of FET 704, and so on, with the drain terminal of FET 709 being coupled through current-conducting node 719 to port 748.

As with the stack 600 depicted in FIG. 6, simultaneous control of all FETs 701-709 in the stack 700 is accomplished by electrically coupling the gate terminals of the FETs 701-709 to a single stack control terminal 758. To cause the entire stack 700 to become substantially conductive between the ports to which the stack is connected (e.g., to turn the stack "on" or to "close" the switch), a driver (e.g., of switch controller 150, 250, FIGS. 1, 2) provides a drive signal to the stack control terminal 758. That control signal causes all of the FETs 701-709 within the stack 700 simultaneously to become substantially conducting, thus causing stack 700 to become substantially conductive between ports 728 and 748.

In addition, stack 700 may include a DC bias distribution network of high-value (e.g., multiple kiloohm) resistors (e.g., including resistor 763), in an embodiment, where each resistor is coupled between the source and drain terminals of a FET 701-709. Further, stack 700 also may include an RF blocking network of high-value (e.g., multiple kiloohm) resistors (e.g., resistor 760) coupled between the gate terminals of the FETs 701-709 and the stack control terminal 758, in an embodiment. Further still, stack 700 also may include body bias circuitry coupled between the body node of each FET, if included, and the body bias terminal (e.g., body bias terminal 724, FIG. 7). The body bias circuitry also may include an RF blocking network of high-value (e.g., multiple kiloohm) resistors (e.g., resistor 761) coupled between the body nodes of the FETs and a body bias terminal 762 for the stack 700, in an embodiment.

Figure 7:
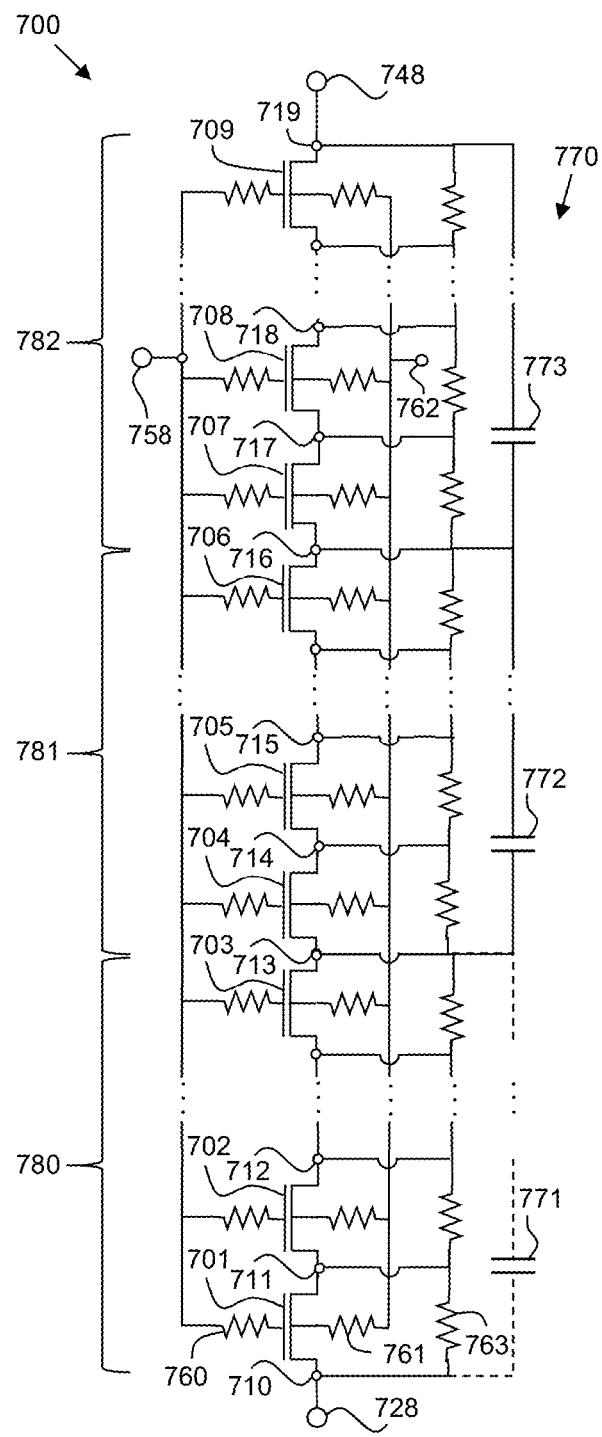
FIG. 7 is a simplified circuit diagram of a stack of FETs that may be used in one or more branches of an RF switch, in accordance with another embodiment.

To balance the voltage distribution across the stack 700, and thus to increase the RF voltage handling capability of the stack 700, stack 700 also includes a network 770 of balancing capacitors 771-773, in an embodiment. Again, the balancing capacitors 771-773 are coupled between some (but not all) of the current-conducting nodes 710-719 of the stack 700, in an embodiment, meaning that each balancing capacitor is connected across a different group of multiple FETs 701-709 in the stack 700. In the embodiment of FIG. 7, for example, each balancing capacitor 771-773 is connected across a different group of three or more adjacent FETs in the series-coupled arrangement of FETs 701-709 in stack 700. More specifically, a first balancing capacitor 771 is coupled across a first group 780 of three or more FETs 701-703, where a first terminal of capacitor 771 is coupled to current-conducting node 710 (and thus to the source of FET 701), and a second terminal of capacitor 771 is coupled to current-conducting node 713 (and thus to the drain of FET 703 and the source of FET 704). Node 710 may be considered to be an "input" of the first group of FETs 701-703, and node 713 may be considered to be an "output" of the first group of FETs 701-703. A second balancing capacitor 772 is coupled across a second group 781 of three or more FETs 704-706, where a first terminal of capacitor 772 is coupled to current-conducting node 713 (and thus to the drain of FET 703 and the source of FET 704), and a second terminal of capacitor 772 is coupled to current-conducting node 716 (and thus to the drain of FET 706 and the source of FET 707). Node 713 may be considered to be an "input" of the second group of FETs 704-706, and node 716 may be considered to be an "output" of the second group of FETs 704-706. Finally, a third balancing capacitor 773 is coupled across a third group 782 of three or more FETs 707-709, where a first terminal of capacitor 773 is coupled to current-conducting node 716 (and thus to the drain of FET 706 and the source of FET 707), and a second terminal of capacitor 773 is coupled to current-conducting node 719 (and thus to the drain of FET 709 and terminal 748). Node 716 may be considered to be an "input" of the third group of FETs 707-709, and node 719 may be considered to be an "output" of the third group of FETs 707-709. It should be noted that current-conducting nodes that are in-between the FETs in any given group (e.g., current-conducting nodes 711 and 712) are not directly connected to the network 770 of balancing capacitors 771-773. In addition, although FIG. 7 depicts three groups 780-782 of FETs, stack 700 may have as few as two groups or more than three groups, in other embodiments. According to an embodiment, each of the balancing capacitors 771-773 has a capacitance value in a range of about 50 fF to about 500 fF, although the capacitance values may be lower or higher, as well.

In some embodiments, balancing capacitors 771-773 are connected across all of the groups of FETs 701-709 in the stack 700. In other embodiments, balancing capacitors may be connected across some, but not all, FETs in the stack 700. For example, as indicated with the dashed-line connections between balancing capacitor 771 and nodes 710, 713, balancing capacitor 771 may be omitted. In other embodiments, one or more other or additional balancing capacitors may be omitted (e.g., balancing capacitor 772 and/or 773 also or alternatively may be omitted).

Figure 8:
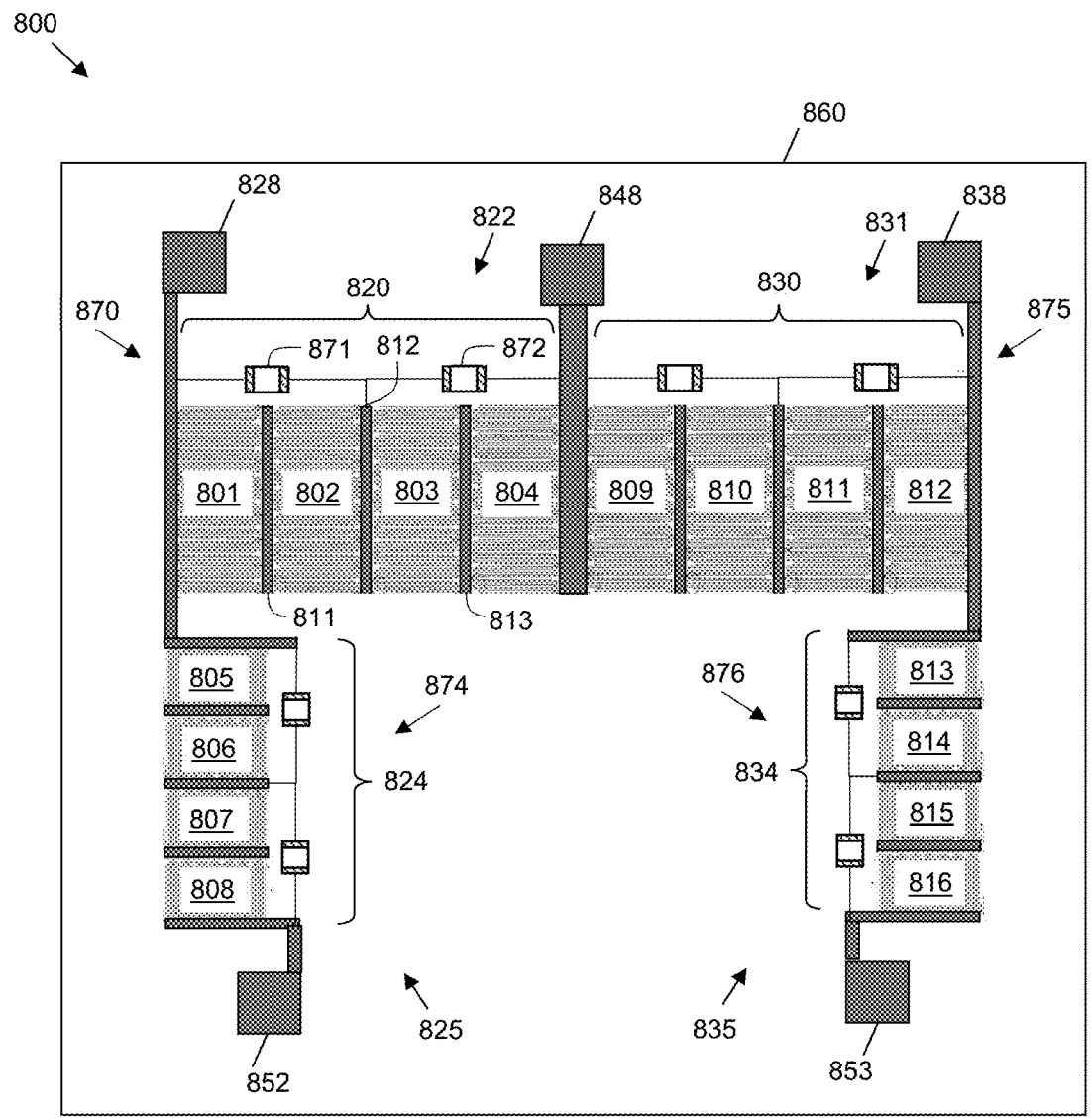
FIG. 8 is a top view of a monolithic RF switch integrated circuit (IC) that embodies the RF switch of FIG. 5 with FET stacks similar to that depicted in FIG. 6, in accordance with an embodiment.

An embodiment of an RF switch integrated circuit (IC) that embodies circuitry consistent with FIGS. 5 and 6 will now be described. More particularly, FIG. 8 is a top view of a monolithic RF switch IC 800 that embodies the RF switch 500 of FIG. 5 with FET stacks (or branches), each of which includes a balancing capacitor network 870 (e.g., network 670, FIG. 6), in accordance with an example embodiment. RF switch IC 800 includes a plurality of branches 820, 824, 830, 834 (e.g., branches 520, 524, 530, 534, FIG. 5). Each branch includes a FET stack 822, 825, 831, 835 (e.g., each similar to stack 600, FIG. 6), and each FET stack includes four, series-coupled FETs 801-804, 805-808, 809-812, 813-816. According to an embodiment, the branches 820, 824, 830, 834 may form portions of a single, monolithic semiconductor chip (i.e., a single semiconductor substrate). Alternatively, some or all of the branches 820, 824, 830, 834 may be included within distinct semiconductor chips that are electrically connected together using wirebonds and/or other electrically conductive structures.

According to on embodiment, the RF switch IC 800 is "monolithic," in that the FETs 801-816 are formed in and on a single integrated circuit substrate 860. For example, according to an embodiment, the RF switch IC 800 may be formed on a gallium arsenide (GaAs)-based substrate 860, although those of skill in the art would understand, based on the description herein, that the circuitry of the RF switch may be formed on other types of substrates, as well, including silicon (Si)-based substrates (e.g., bulk Si CMOS, silicon-on insulator (Sol) CMOS, and so on) and gallium nitride (GaN)-based substrates (e.g., GaN on silicon, GaN on silicon carbide (SiC), and so on). Further, the FETs may include metal oxide semiconductor FETs (MOSFETs), high electron mobility transistors (HEMTs), metal-semiconductor field effect transistors (MESFETs), laterally diffused metal-oxide semiconductor (LDMOS) FETs, Enhancement-mode MOSFETs (EMOSFETs), and/or junction gate FETs (JFETs), to name a few.

In addition to branches 820, 824, 830, 834, RF switch IC 800 includes a plurality of I/O, control, and voltage reference nodes 828, 838, 848, 852, 853, each of which may provide for electrical connectivity with external circuitry (e.g., connectivity with antenna 140, transmitter 120, receiver 130, 230, circulator 216, RF switch controller 150, 250, and so on) and/or electrical connectivity with one or more power sources and/or voltage references (e.g., power, ground and other voltage references). For example, some or all of the I/O, control, and voltage reference nodes 828, 838, 848, 852, 853 may be implemented as conductive pads that are exposed at a top surface of the RF switch IC 800. Accordingly, the various nodes 828, 838, 848, 852, 853 may serve as bond pads for wirebonds (e.g., wirebonds 370, FIG. 3), which provide for electrical connectivity to the above-mentioned external circuitry or to other circuitry. According to an embodiment, the various nodes include a first node 828 (e.g., node 128, 228, 528, FIGS. 1, 2, 5), a second node 838 (e.g., node 138, 238, 538, FIGS. 1, 2, 5), a third node 848 (e.g., node 148, 248, 548, FIGS. 1, 2, 5), and voltage reference nodes 852, 853 (e.g., reference nodes 552, 553, FIG. 5).

For each FET 801-816, the electrical conductivity of the FET channel between the source and drain terminals is controlled by control signals provided to each gate structure through a gate terminal (e.g., terminal 621, FIG. 6). To enable such channel conductivity control, RF switch IC 800 also includes a plurality of control nodes (not illustrated in FIG. 8, but corresponding to control terminal 658, FIG. 6) that enable control signals to be provided by external circuitry to the gate terminals of the FETs 801-816. According to an embodiment, the control signals provided to the FETs in any particular branch 820, 824, 830, 834 are synchronous, in that they simultaneously cause all of the FETs in that branch either to be substantially conducting (e.g., "on" or "closed") or substantially non-conducting (e.g., "off" or "open").

A first branch 820, consisting of a first stack 822 of series-coupled FETs 801, 802, 803, 804 (e.g., FETs 701-703, FIG. 7), is electrically coupled between node 828 and node 848. More specifically, a source terminal of FET 801 is electrically coupled to node 828, a drain terminal of FET 801 is electrically coupled to a source terminal of FET 802, a drain terminal of FET 802 is electrically coupled to a source terminal of FET 803, a drain terminal of FET 803 is electrically coupled to a source terminal of FET 804, and a drain terminal of FET 804 is electrically coupled to node 848, in an embodiment.

In addition to the series-coupled FETs 801-804, the first branch 820 also includes a network 870 of balancing capacitors 871, 872 (e.g., similar to network 670, FIG. 6) coupled to stack 822. In the embodiment of FIG. 8, a first balancing capacitor 871 is coupled across a first group of two FETs 801 and 802, where a first terminal of capacitor 871 is coupled to node 828 (and thus to the source of FET 801), and a second terminal of capacitor 871 is coupled to intermediate current-conducting node 812 (and thus to the drain of FET 802 and the source of FET 803). A second balancing capacitor 872 is coupled across a second group of two FETs 803 and 804, where a first terminal of capacitor 872 is coupled to current-conducting node 812 (and thus to the drain of FET 802 and the source of FET 803), and a second terminal of capacitor 872 is coupled to node 848 (and thus to the drain of FET 804). It should be noted that current-conducting nodes that are in-between the FETs in any given group (e.g., current-conducting nodes 811 and 813) are not directly connected to the network 870 of balancing capacitors 871, 872.

According to an embodiment, each of the capacitors 871, 872 in the balancing capacitor network 870 may be a metal-insulator-metal (MIM) capacitor that is integrally formed with the substrate (e.g., a first electrode formed from a portion of a first metal layer, a second electrode formed from a portion of a second metal layer, and an insulating layer (e.g., silicon nitride or other suitable insulating materials) sandwiched between the first and second electrodes). In other embodiments, capacitors 871, 872 may be discrete capacitors that are electrically coupled to the top surface of the semiconductor substrate.

A second branch 824, consisting of a second stack 825 of series-coupled FETs 805, 806, 807, 808, is electrically coupled between node 828 and voltage reference node 852. More specifically, in stack 825, a drain terminal of FET 805 is electrically coupled to node 828, a source terminal of FET 805 is electrically coupled to a drain terminal of FET 806, a source terminal of FET 806 is electrically coupled to a drain terminal of FET 807, a source terminal of FET 807 is electrically coupled to a drain terminal of FET 808, and a source terminal of FET 808 is electrically coupled to voltage reference node 852. Similar to branch 820, the second branch 824 also includes a network 874 of balancing capacitors, which are electrically coupled to FETs 805-808 in a manner similar to the connection of network 870 to stack 822.

A third branch 830, consisting of a third stack 831 of series-coupled FETs 809, 810, 811, 812, is electrically coupled between node 848 and node 838. More specifically, in stack 831, a drain terminal of FET 809 is electrically coupled to node 848, a source terminal of FET 809 is electrically coupled to a drain terminal of FET 810, a source terminal of FET 810 is electrically coupled to a drain terminal of FET 811, a source terminal of FET 811 is electrically coupled to a drain terminal of FET 812, and a source terminal of FET 812 is electrically coupled to node 838. Also similar to branch 820, the third branch 830 also includes a network 875 of balancing capacitors, which are electrically coupled to FETs 809-812 in a manner similar to the connection of network 870 to stack 822.

Finally, a fourth branch 834, consisting of a fourth stack 835 of series-coupled FETs 813, 814, 815, 816, is electrically coupled between node 838 and voltage reference node 853. More specifically, a drain terminal of FET 813 is electrically coupled to node 838, a source terminal of FET 813 is electrically coupled to a drain terminal of FET 814, a source terminal of FET 814 is electrically coupled to a drain terminal of FET 815, and a source terminal of FET 815 is electrically coupled to a drain terminal of FET 816, and a source terminal of FET 816 is electrically coupled to voltage reference node 853, in an embodiment. Also similar to branch 820, the fourth branch 834 also includes a network 876 of balancing capacitors, which are electrically coupled to FETs 813-816 in a manner similar to the connection of network 870 to stack 822. When incorporated into a larger electrical system (e.g., transceiver 100, 200, FIGS. 1, 2), voltage reference nodes 852, 853 typically would be coupled to a ground reference (e.g., zero volts), although nodes 852, 853 alternatively could be coupled to a positive or negative DC voltage reference, as well.

Figure 9:
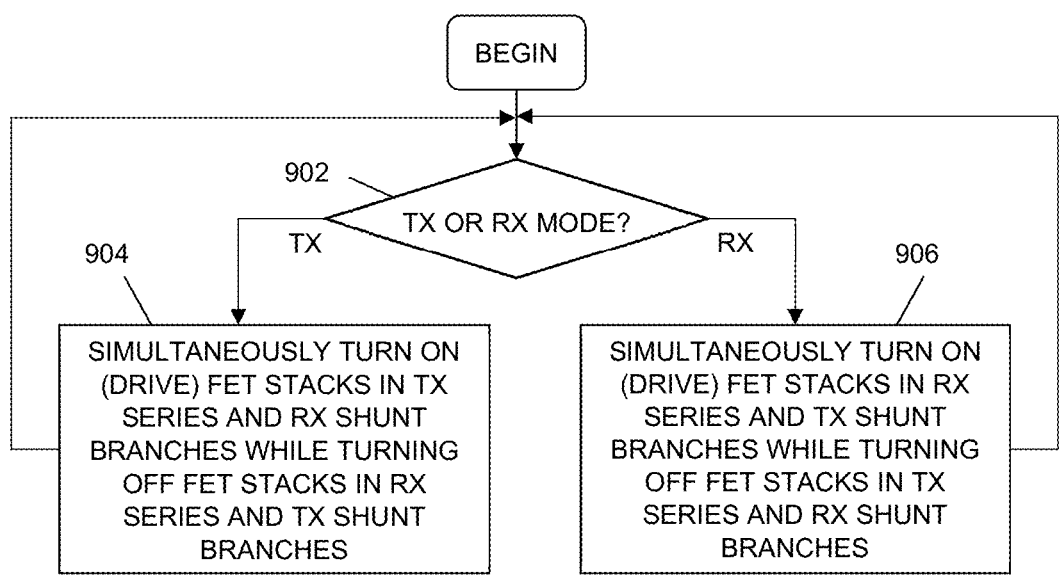
FIG. 9 is a flowchart of a method of operating an RF switch in an RF transceiver, in accordance with an embodiment.

!FIG. 9 is a flowchart of a method of operating an RF switch (e.g., RF switch 110, 210, 310, 410, 500, 800, FIGS. 1-5, 8) in an RF transceiver (e.g., transceiver 100, 200, FIGS. 1, 2), in accordance with an embodiment. The method may begin, in block 902, when a determination is made (e.g., by RF switch controller 150, 250, FIGS. 1, 2) whether the RF transceiver should be configured in a transmit (TX) mode or a receive (RX) mode. For example, this determination may be made based on a TX/RX control signal from a higher-level communication controller.

When the transceiver is to be configured in a transmit mode configuration, then in block 904, the FET stacks in the TX series and RX shunt branches (e.g., branches 520, 534, 820, 824, FIGS. 5, 8) simultaneously are turned on, while the FET stacks in the RX series and the TX shunt branches (e.g., branches 530, 524, 830, 824, FIGS. 5, 8) simultaneously are turned off. To achieve this, the drivers of the RF switch controller provide control signals to the control nodes (e.g., terminals 658, 758, FIGS. 6, 7) of the various FET stacks of the RF switch to configure the RF switch in the transmit mode configuration. For example, to configure the RF switch 500 of FIG. 5 into the transmit mode configuration, one or more drivers of the RF switch controller may send first control signals to stack control terminals of branches 520 and 534 to simultaneously turn on branches 520 and 534 (i.e., to close switches 521, 535 to establish low-impedance paths between nodes 528 and 548, and between nodes 538 and 553). At the same time, one or more drivers of the RF switch controller may send second control signals to stack control terminals of branches 524 and 530 to simultaneously turn off branches 524 and 530 (i.e., to open switches 525, 531 to establish high-impedance conditions between nodes 528 and 552 and between nodes 538 and 548). The RF switch controller continues to send these control signals to the various control nodes until a determination is made (in block 902) that the transceiver is to be configured in a receive mode.

When the transceiver is to be configured in a receive mode configuration, then in block 906, the FET stacks in the RX series and TX shunt branches (e.g., branches 530, 524, 830,

834, FIG. 5, 8) simultaneously are turned on, while the FET stacks in the TX series and the RX shunt branches (e.g., branches 520, 534, 820, 834, FIGS. 5, 8) simultaneously are turned off. To achieve this, the drivers of the RF switch controller provide control signals to the control nodes (e.g., terminals 658, 758, FIGS. 6, 7) of the various FET stacks of the RF switch to configure the RF switch in the receive mode configuration. For example, to configure the RF switch 500 of FIG. 5 into the receive mode configuration, one or more drivers of the RF switch controller may simultaneously send third control signals to stack control terminals of branches 524 and 530 to simultaneously turn on branches 524 and 530 (i.e., to close switches 525, 531 to establish low-impedance paths between nodes 538 and 548, and between nodes 528 and 552). At the same time, one or more drivers of the RF switch controller may send fourth control signals to stack control terminals of branches 520 and 534 to simultaneously turn off branches 520 and 534 (i.e., to open switches 521, 535 to establish high-impedance conditions between nodes 528 and 548 and between nodes 538 and 553). The RF switch controller continues to send these control signals to the various control nodes until a determination again is made (in block 902) that the transceiver is to be configured in a transmit mode.

An embodiment of a switch circuit includes a first port, a second port, and a first transistor stack coupled between the first and second ports. The first transistor stack includes a first group of multiple, adjacent, series-coupled transistors, and at least one additional transistor coupled in series with the first group between the first and second ports to provide a first variably-conductive path between the first and second ports. The switch circuit also includes a first balancing capacitor with a first terminal coupled to an input of the first group of multiple, adjacent, series-coupled transistors, and a second terminal coupled to an output of the first group of multiple, adjacent, series-coupled transistors.

According to a further embodiment, the first group of multiple, adjacent, series-coupled transistors includes a first transistor with a first current-conducting terminal and a second current-conducting terminal, and a second transistor with a third current-conducting terminal and a fourth current-conducting terminal, the first terminal of the first balancing capacitor is connected to the first current-conducting terminal of the first transistor, the second current-conducting terminal of the first transistor is electrically coupled to the third current-conducting terminal of the second transistor, and the second terminal of the first balancing capacitor is connected to the fourth current-conducting terminal of the second transistor.

According to another further embodiment, the switch circuit also includes a third port, a second transistor stack coupled between the first and third ports, where the second transistor stack comprises a second group of multiple, adjacent, series-coupled transistors, and a second balancing capacitor with a first terminal coupled to an input of the second group of multiple, adjacent, series-coupled transistors, and a second terminal coupled to an output of the second group of multiple, adjacent, series-coupled transistors. According to yet another further embodiment, the switch circuit also includes a third transistor stack coupled between the second port and a ground reference node, where the third transistor stack comprises a third group of multiple, adjacent, series-coupled transistors, and a third balancing capacitor with a first terminal coupled to an input of the third group of multiple, adjacent, series-coupled transistors, and a second terminal coupled to an output of the third group of multiple, adjacent, series-coupled transistors. According to yet another further embodiment, the switch circuit also includes a fourth transistor stack coupled between the third port and the ground reference node, where the fourth transistor stack comprises a fourth group of multiple, adjacent, series-coupled transistors, and a fourth balancing capacitor with a first terminal coupled to an input of the fourth group of multiple, adjacent, series-coupled transistors, and a second terminal coupled to an output of the fourth group of multiple, adjacent, series-coupled transistors.

An embodiment of a transceiver includes a switch circuit that includes a first port, a second port, a third port, and a first transistor stack coupled between the first and second ports, where the first transistor stack includes a first group of multiple, adjacent, series-coupled transistors, and at least one additional transistor coupled in series with the first group between the first and second ports to provide a first variably-conductive path between the first and second ports. The switch circuit of the transceiver further includes a first balancing capacitor with a first terminal coupled to an input of the first group of multiple, adjacent, series-coupled transistors, and a second terminal coupled to an output of the first group of multiple, adjacent, series-coupled transistors. The switch circuit of the transceiver further includes a second transistor stack coupled between the second and third ports, where the second transistor stack comprises a second group of multiple, adjacent, series-coupled transistors, and a second balancing capacitor with a first terminal coupled to an input of the second group of multiple, adjacent, series-coupled transistors, and a second terminal coupled to an output of the second group of multiple, adjacent, series-coupled transistors.

According to a further embodiment of the transceiver, the first port is coupled to one of a receiver or a transmitter, the second port is coupled to an antenna, and the third port is coupled to another one of the transmitter or the receiver. According to another further embodiment, the transceiver also includes a circulator with first, second, and third circulator ports, where the first circulator port is coupled to a transmitter, the second circulator port is coupled to the second port of the switch circuit, and the third circulator port is coupled to an antenna. According to another further embodiment, the transceiver also includes a switch controller configured to simultaneously configure the first transistor stack in a low-impedance state, and to configure the second transistor stack in a high-impedance state.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the foregoing technical field, background, or detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A switch circuit comprising:
   a first port;
   a second port;
   a first transistor stack coupled between the first and second ports, wherein the first transistor stack comprises a first group of multiple, adjacent, series-coupled transistors, and at least one additional transistor coupled in series with the first group between the first and second ports to provide a first variably-conductive path between the first and second ports; and
   a first balancing capacitor with a first terminal coupled to an input of the first group of multiple, adjacent, series-coupled transistors, and a second terminal coupled to an output of the first group of multiple, adjacent, series-coupled transistors.

2. The switch circuit of claim 1, wherein:
   the first group of multiple, adjacent, series-coupled transistors includes a first transistor with a first current-conducting terminal and a second current-conducting terminal, and a second transistor with a third current-conducting terminal and a fourth current-conducting terminal;
   the first terminal of the first balancing capacitor is connected to the first current-conducting terminal of the first transistor;
   the second current-conducting terminal of the first transistor is electrically coupled to the third current-conducting terminal of the second transistor; and
   the second terminal of the first balancing capacitor is connected to the fourth current-conducting terminal of the second transistor.

3. The switch circuit of claim 1, wherein the first group of multiple, adjacent, series-coupled transistors includes two transistors.

4. The switch circuit of claim 1, wherein the first group of multiple, adjacent, series-coupled transistors includes three or more transistors.

5. The switch circuit of claim 1, wherein:
   the at least one additional transistor comprises a second group of multiple, adjacent, series-coupled transistors; and
   the switch circuit further includes a second balancing capacitor with a first terminal coupled to an input of the second group of multiple, adjacent, series-coupled transistors, and a second terminal coupled to an output of the second group of multiple, adjacent, series-coupled transistors.

6. The switch circuit of claim 1, wherein each transistor of the first transistor stack has a gate terminal coupled to a stack control terminal.

7. The switch circuit of claim 1, further comprising:
   a third port;
   a second transistor stack coupled between the first and third ports, wherein the second transistor stack comprises a second group of multiple, adjacent, series-coupled transistors; and
   a second balancing capacitor with a first terminal coupled to an input of the second group of multiple, adjacent, series-coupled transistors, and a second terminal coupled to an output of the second group of multiple, adjacent, series-coupled transistors.

8. The switch circuit of claim 7, further comprising:
   a third transistor stack coupled between the second port and a ground reference node, wherein the third transistor stack comprises a third group of multiple, adjacent, series-coupled transistors; and
   a third balancing capacitor with a first terminal coupled to an input of the third group of multiple, adjacent, series-coupled transistors, and a second terminal coupled to an output of the third group of multiple, adjacent, series-coupled transistors.

9. The switch circuit of claim 8, further comprising:
   a fourth transistor stack coupled between the third port and the ground reference node, wherein the fourth transistor stack comprises a fourth group of multiple, adjacent, series-coupled transistors; and
   a fourth balancing capacitor with a first terminal coupled to an input of the fourth group of multiple, adjacent, series-coupled transistors, and a second terminal coupled to an output of the fourth group of multiple, adjacent, series-coupled transistors.

10. The switch circuit of claim 1, wherein each transistor of the first transistor stack is a field effect transistor.

11. A transceiver comprising:
    a switch circuit that includes
      a first port,
      a second port,
      a third port,
      a first transistor stack coupled between the first and second ports, wherein the first transistor stack comprises a first group of multiple, adjacent, series-coupled transistors, and at least one additional transistor coupled in series with the first group between the first and second ports to provide a first variably-conductive path between the first and second ports,
      a first balancing capacitor with a first terminal coupled to an input of the first group of multiple, adjacent, series-coupled transistors, and a second terminal coupled to an output of the first group of multiple, adjacent, series-coupled transistors,
      a second transistor stack coupled between the second and third ports, wherein the second transistor stack comprises a second group of multiple, adjacent, series-coupled transistors, and
      a second balancing capacitor with a first terminal coupled to an input of the second group of multiple, adjacent, series-coupled transistors, and a second terminal coupled to an output of the second group of multiple, adjacent, series-coupled transistors.

12. The transceiver of claim 11, wherein:
the first port is coupled to one of a receiver or a transmitter;
the second port is coupled to an antenna; and
the third port is coupled to another one of the transmitter or the receiver.

13. The transceiver of claim 11, further comprising:
a circulator with first, second, and third circulator ports, wherein the first circulator port is coupled to a transmitter, the second circulator port is coupled to the second port of the switch circuit, and the third circulator port is coupled to an antenna.

14. The transceiver of claim 11, further comprising:
a switch controller configured to simultaneously configure the first transistor stack in a low-impedance state, and to configure the second transistor stack in a high-impedance state.

15. The transceiver of claim 11, further comprising:
a third transistor stack coupled between the first port and a ground reference node, wherein the third transistor stack comprises a third group of multiple, adjacent, series-coupled transistors;
a third balancing capacitor with a first terminal coupled to an input of the third group of multiple, adjacent, series-coupled transistors, and a second terminal coupled to an output of the third group of multiple, adjacent, series-coupled transistors;
a fourth transistor stack coupled between the third port and the ground reference node, wherein the fourth transistor stack comprises a fourth group of multiple, adjacent, series-coupled transistors; and
a fourth balancing capacitor with a first terminal coupled to an input of the fourth group of multiple, adjacent, series-coupled transistors, and a second terminal coupled to an output of the fourth group of multiple, adjacent, series-coupled transistors.

16. The transceiver of claim 15, further comprising:
a switch controller configured to simultaneously configure the first and third transistor stacks in a low-impedance state, and to configure the second and fourth transistor stacks in a high-impedance state.

17. The transceiver of claim 11, wherein the transceiver is packaged in a surface mount package.

18. The transceiver of claim 11, wherein the transceiver is configured as a printed circuit board module.

* * * * *